(12) United States Patent
Petroski

(10) Patent No.: US 7,145,179 B2
(45) Date of Patent: Dec. 5, 2006

(54) MAGNETIC ATTACHMENT METHOD FOR LED LIGHT ENGINES

(75) Inventor: James Petroski, Parma, OH (US)

(73) Assignee: GELcore LLC, Valley View, OH (US)

( * ) Notice: Subject to any disclaimer, the term of this patent is extended or adjusted under 35 U.S.C. 154(b) by 26 days.

(21) Appl. No.: 10/962,947

(22) Filed: Oct. 12, 2004

(65) Prior Publication Data

US 2006/0076672 A1    Apr. 13, 2006

(51) Int. Cl.
*H01L 21/00* (2006.01)

(52) U.S. Cl. ............... 257/81; 257/706; 257/E23.101; 438/122

(58) Field of Classification Search .......... 257/81, 257/82, 88, 98, 706, 707; 438/122, 125
See application file for complete search history.

(56) References Cited

U.S. PATENT DOCUMENTS

| | | | | |
|---|---|---|---|---|
| 3,612,955 A | * | 10/1971 | Butherus et al. | 361/779 |
| 5,447,886 A | * | 9/1995 | Rai | 228/180.22 |
| 5,771,154 A | * | 6/1998 | Goodman et al. | 361/704 |
| 6,428,189 B1 | | 8/2002 | Hochstein | |
| 6,481,874 B1 | | 11/2002 | Petroski | |
| 6,582,100 B1 | | 6/2003 | Hochstein et al. | |
| 6,897,486 B1 | * | 5/2005 | Loh | 257/81 |
| 2001/0004131 A1 | * | 6/2001 | Masayuki et al. | 257/720 |
| 2005/0050569 A1 | * | 3/2005 | Yamanaka et al. | 720/683 |

OTHER PUBLICATIONS

International Search Report, ISA/US, mailing date Apr. 7, 2006, PCT/US05/29767, International Filing date Aug. 23, 2005.

* cited by examiner

*Primary Examiner*—Roy Potter
(74) *Attorney, Agent, or Firm*—Fay, Sharpe, Fagan, Minnich & McKee, LLP

(57) ABSTRACT

A light engine (16) includes at least one LED (12) for generating light of one of a plurality of wavelengths. The LED (12) is disposed on the magnetic core printed circuit board (14). A heatsink (26) is disposed in thermal communication with a base (24) and the LED (12) for conducting thermal energy away from the LED (12). The light engine (16) is magnetically attached to the heatsink (26) via a magnet (50) which is attached to the heatsink (26) to create that a magnetic force between the magnetic core board (14) and the heatsink (26).

15 Claims, 2 Drawing Sheets

MAGNETIC ATTACHMENT METHOD FOR LED LIGHT ENGINES

BACKGROUND

The present application relates to the lighting arts. It finds particular application in conjunction with an LED-based light source, and will be described with particular reference thereto. However, it is to be appreciated that the present application is also amenable to other similar applications.

LEDs for high brightness systems are often surface mount devices soldered to metal core printed circuit boards (MCPCBs). The MCPCBs, which carry the LEDs, are attached in various ways to heatsinks or thermally conductive fixtures.

One common method of attachment of the board to the heatsink is by way of mechanical fasteners such as screws. However, where the heated components, e.g. LED boards, are clamped to the heatsinks with screws and insulating washers, it is common to experience a decrease in heat transfer efficacy over time. Long term creep or plastic deformation of the attachment might reduce the original clamping force to a fraction of the original value. This greatly compromises heat flow across the mounting interface, which may lead to thermally induced failure of the light source.

Another common method of attachment of the board to the heatsink is with an adhesive. Adhesive attachment systems are generally more resistant to high temperature operation, but sometimes exhibit detachment due to repeated temperature cycling. The relatively large differences in thermal expansion coefficients of plastics, epoxies and metals can give rise to substantial stress at the attachment region. Such stress may exceed the strength of the adhesive and may eventually result in the attachment failure.

Further inconveniences associated with attachment via mechanical fasteners and/or adhesives, is that each requires surface preparation and neither is well suited for easy detachment of the LEDs from the board.

BRIEF DESCRIPTION

In accordance with one aspect of the present application, a light assembly comprises a platform, on which at least one LED is disposed, and a heatsink for conducting thermal energy away from the platform. The heatsink and the platform are joined by at least one magnet.

In accordance with another aspect of the present application, a method for attaching two parts in a light assembly is disclosed. A light engine including a platform and at least one LED disposed on the platform is provided. The light engine is magnetically attached to a heatsink to conduct thermal energy away from the at least one LED.

One advantage of the present application resides in quick attachment/detachment of the LED light engines.

Another advantage resides in reducing the thermal resistance across the interface(s).

Another advantage resides in improved alignment and attachment of parts during the assembly process.

DETAILED DESCRIPTION

Figure 1:
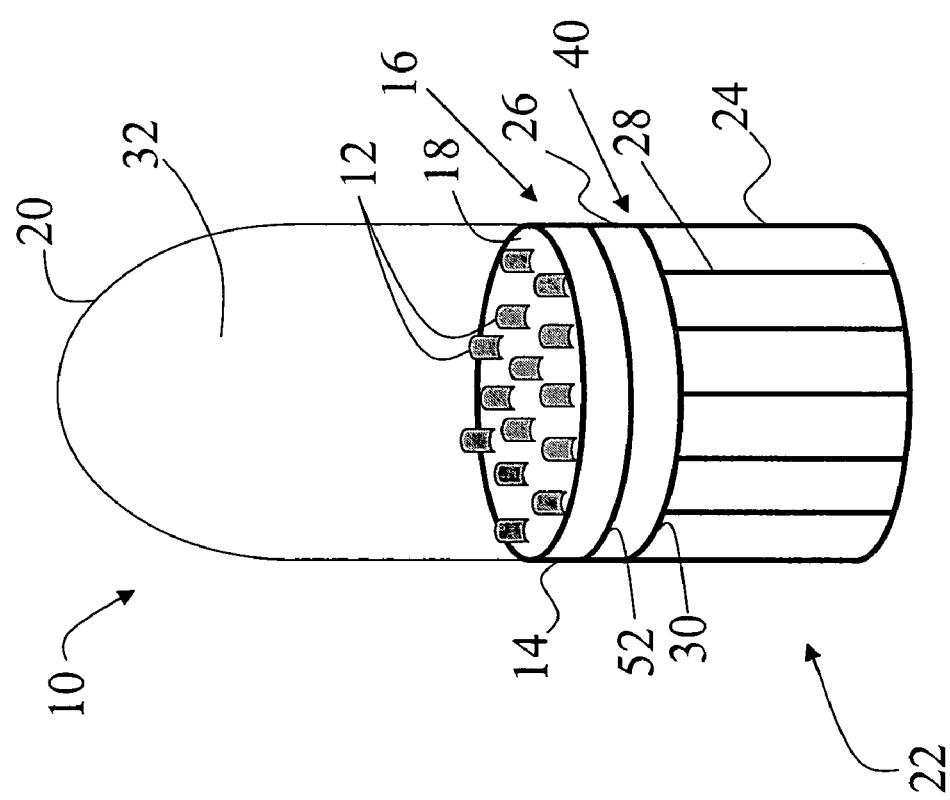
FIG. 1 schematically shows a cross-section of an LED-based lamp.

With reference to FIG. 1, a lighting system 10 includes one or more LEDs 12 which are positioned on a mounting platform 14, defining a light engine 16. The LEDs 12 are attached to an upper surface 18 of the platform 14 by one of solder, wirebonding, thermosonic, thermocompression, electrical conductive adhesives, thermal conductive adhesives, other suitable means, or a combination of the above. The LEDs 12 can be inorganic or organic light emitting devices which emit light in a spectrum from UV to infrared. Variations in optical performance, viewing angles, and intensity levels are achieved by arranging the LEDs in different patterns. The lighting system 10 includes a light cover or enclosure 20. The enclosure 20 can be spherical, elliptical, cylindrical, domed, squared, n-sided, or any other shape. Preferably, the enclosure 20 is built of light transparent or translucent materials, or a combination thereof. The enclosure 20 materials are selected from glass, plastic, acrylic, polycarbonate, or other suitable materials.

At least one heat dissipater 22 is integrally disposed in thermal communication with the light engine 16 and a base 24 to take the heat away from the LEDs 12. Preferably, the heat dissipater 22 includes a heatsink 26 with a spreader 28 located at a lower surface 30 of the heatsink 26. The heatsink is constructed from the material capable of conducting the heat away from the LEDs 12 such as copper, aluminum, silicon carbide, boron nitride and others known to have a high coefficient of thermal conductivity. In one embodiment, an intermediate thermally conductive member (not shown) is provided between the light engine 16 and the heatsink 26. Preferably, the platform 14 is a printed circuit board which is magnetically attached to the heat dissipater 22 as will be discussed in a greater detail below.

Preferably, the base 24 is one of commercially available light bulb sockets for easy field exchange and retrofitting of the light bulb with the LED light engine 16 such that the enclosure 20 can be fitted over the light engine 16. Such design allows the conventional lamp to be replaced with a variety of different LED light engines without modification to the lamp socket or to the lamp enclosure. Optionally, the base 24 is custom manufactured.

Preferably, an index matching material 32 is applied to encompass the light engine 16 to improve the light extraction. The index matching material is selected from silicones, acrylics, epoxies, thermoplastics, glasses and any other appropriate materials. Optionally, an index matching fluid, which preferably serves as a thermal spreading medium, is present between the light engine 16 and the cover 20. The fluid is selected from solids, gels, liquids, fluorocarbon coolants, luminescent materials and others to create a desired visual effect. Additionally, reflective or translucent particles may added to the fluid for further visual effects. The cover 20 works together with the internal fluid to optimize light extraction and/or provide visual effects. In one embodiment, the index matching material 32 is structured to provide lensing.

In order to provide suitable electrical power to the LEDs 12, the lighting system 10 includes one or more of an electric power conversion circuit, control electronics, or power electronics circuits 40, which are preferably integrated with the light engine 16. Alternatively, the electric power conversion circuit 40 can be adjacent the light engine 16, located within the base 24, or disposed remotely from the lighting system 10. In one embodiment, the electric power conversion circuit 40 includes an AC/DC converter which permits the LED-based lighting system 10 to be powered by a standard domestic 120 VAC or international 220 VAC user voltage.

Preferably, the lighting system 10 includes a wavelength converting material such as organic or inorganic phosphor. The phosphor can be located in any suitable location, such as integrated into the LED 12, inside or outside the cover 20, contained within the cover 20, or a combination thereof.

Figure 2:
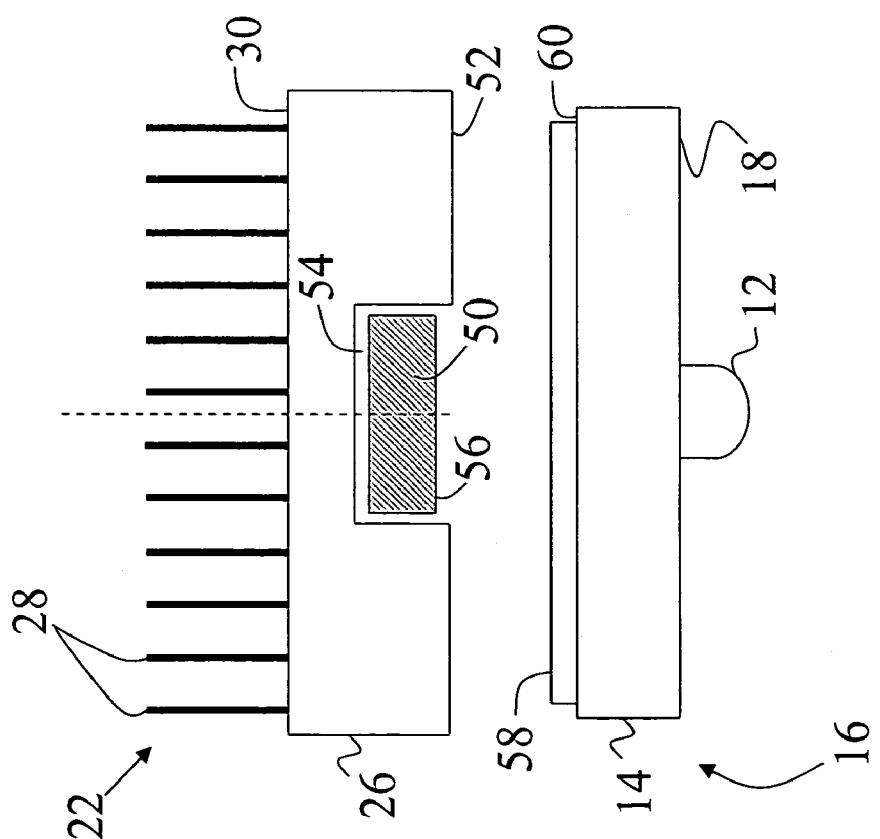
FIG. 2 schematically shows a cross-section of a portion of an LED-based lamp which includes a magnetic core printed circuit board.

With reference to FIG. 2, the platform 14 is a magnetic core printed circuit board (MCPCB) which is manufactured from a magnetic base material such as, but not limited to, steel. The platform 14 is attached to the heat dissipater 22 by a use of a magnet 50 which is attached to the heatsink 26 about an upper surface 52. More particularly, the magnet 50 is embedded in a recess 54, which is positioned about a central axis of the heatsink 26, such that a first surface 56 of the magnet 50 is exposed to create a magnetic attraction between the heatsink 26 and the platform 14. The-magnetic force captures the platform 14 in place, securely holding the light engine 16, and provides enough normal force to create a low thermal resistance across the interface. A substantial area of the heatsink upper surface 52 is exposed to contact the platform 14 for an efficient heat transfer. Optionally, a layer of a thermal interface material 58 is disposed between the heatsink 26 and a lower surface 60 of the platform 14 to further help decrease the thermal resistance across the MCPCB to the heatsink 26. A variety of filled or unfilled greases, gels, or viscoelastic materials can reduce the thermal impedance of the interface in order to maximize the heat transfer.

Figure 3:
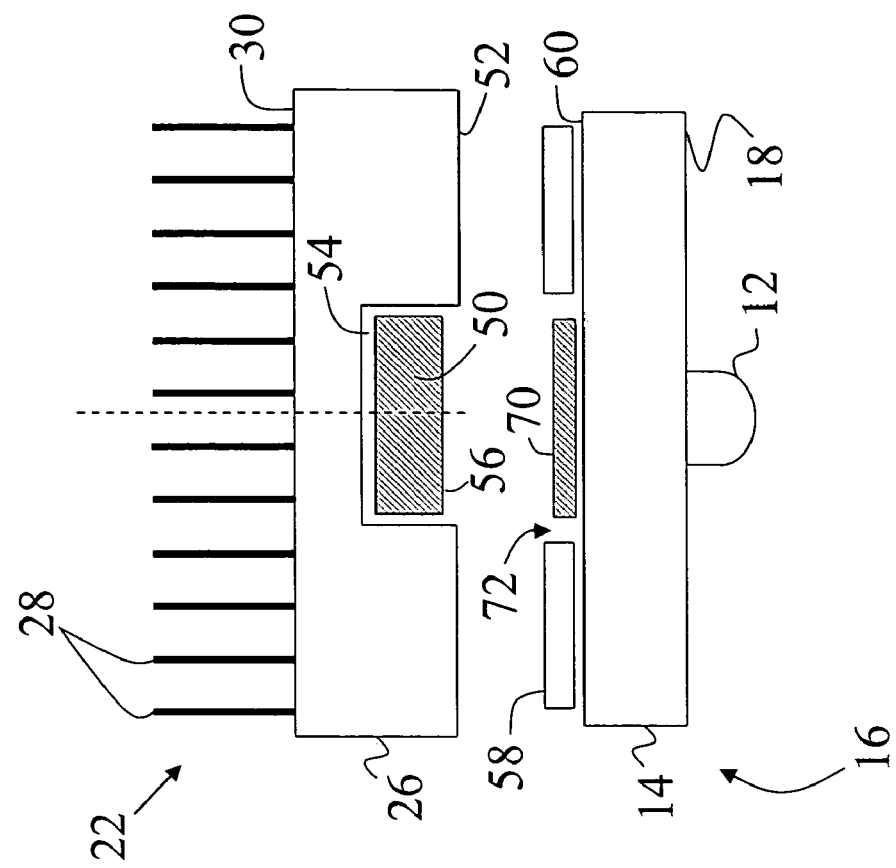
FIG. 3 schematically shows a cross-section of a portion of an LED-based lamp which includes a non-magnetic printed circuit board.

With reference to FIG. 3, the platform 14 is manufactured from a nonmagnetic material such as aluminum. Of course, it is also contemplated that the platform 14 can be manufactured from any other nonmagnetic material. As it was described above with the reference to FIG. 2, the magnet 50 is embedded in the recess 54, which is positioned about the central axis of the heatsink 26 to expose the first surface 56 of the magnet 50. A second magnet or magnetic strip material 70 is attached to the lower surface 60 of the platform 14 to create a magnetic attraction between the heatsink 26 and the platform 14. Optionally, the layer of the thermal interface material 58 is disposed between the heatsink 26 and the platform lower surface 60 to help lower the interface thermal resistance. The material 60 preferably includes a second recess 72 in which the second magnet 70 is embedded.

Of course, it is also contemplated that the magnetic attachment can be used anywhere downstream in the thermal path from the LED light engine 16, where any of two parts of the lighting system 10 need to be joined and a thermal path for an efficient heat transfer needs to be maintained.

The present application has been described with reference to the preferred embodiments. Obviously, modifications and alterations will occur to others upon reading and understanding the preceding detailed description. It is intended that the present application be construed as including all such modifications and alterations insofar as they come within the scope of the appended claims or the equivalents thereof.

The invention claimed is:

1. A light assembly comprising:
    a platform having at least one LED disposed on the platform; and
    a heatsink for conducting thermal energy away from platform which is joined to the heatsink via at least one magnet.

2. The light assembly according to claim 1, wherein the magnet is embedded in the heatsink.

3. The light assembly according to claim 2, wherein the platform comprises a magnetic core printed circuit board (MCPCB).

4. The light assembly according to claim 2, wherein the platform comprises a nonmagnetic material and further including a magnetic material disposed on or within the platform.

5. The light assembly according to claim 1, further including:
    a thermal material disposed about a lower surface of the platform in thermal communication with a substantial portion of an upper surface of the heatsink to reduce a thermal resistance between the platform and the heatsink.

6. The light assembly according to claim 1, wherein the magnetic attachment between the platform and the heatsink is adapted for a quick detachment.

7. A method of attaching two parts in a light assembly, the method comprising:
    providing a light engine which includes a platform, and at least one LED disposed on the platform; and
    magnetically attaching the light engine to a thermally conductive member to conduct thermal energy away from the at least one LED.

8. The method according to claim 7, wherein the thermally conductive member comprises a heatsink.

9. The method according to claim 8, further including: attaching a magnet to the heatsink.

10. The method according to claim 9, further including: embedding the magnet in the heatsink.

11. The method according to claim 9, wherein the platform comprises a magnetic core printed circuit board (MCPCB).

12. The method according to claim 9, wherein the platform comprises a nonmagnetic material.

13. The method according to claim 12, further including: attaching a magnetic material to the platform.

14. The method according to claim 8, further including: reducing a thermal resistance between the platform and the heatsink including attaching a thermal material about a lower surface of the platform in thermal communication with a light engine and a substantial portion of an upper surface of the heatsink.

15. A light comprising:
    a light engine including a platform on which LEDs are positioned;
    a heatsink for conducting thermal energy away from the light engine; and
    a magnetic interface disposed between the light engine and the heatsink which magnetic interface creates a magnetic force which keeps the light engine and the heatsink detachably attached to one another.

* * * * *